(12) United States Patent
Chang et al.

(10) Patent No.: US 7,041,540 B1
(45) Date of Patent: May 9, 2006

(54) THIN FILM TRANSISTOR AND METHOD FOR FABRICATING THE SAME

(75) Inventors: Hsi-Ming Chang, Taoyuan (TW); Chia-Nan Shen, Taipei (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 0 days.

(21) Appl. No.: 10/906,041

(22) Filed: Feb. 1, 2005

(51) Int. Cl.
*H01L 21/84* (2006.01)

(52) U.S. Cl. ............... 438/163; 438/286; 438/585

(58) Field of Classification Search ........ 438/151–166, 438/286, 585
See application file for complete search history.

(56) References Cited

U.S. PATENT DOCUMENTS 4,837,180 A * 6/1989 Chao ................. 438/305

2004/0229416 A1 * 11/2004 Shih ................. 438/164

* cited by examiner

*Primary Examiner*—Richard A. Booth
(74) *Attorney, Agent, or Firm*—Jiang Chyun IP Office

(57) ABSTRACT

A thin film transistor includes a substrate, a polysilicon layer, a patterned gate dielectric layer, a gate layer, a channel region, a source region, a drain region, and a LDD region. The polysilicon layer is positioned over the substrate. The patterned gate dielectric layer is positioned over the polysilicon layer. The patterned gate dielectric layer has a third and a fourth portion, wherein the fourth portion has a thickness smaller than that of the third portion. The gate layer is positioned over the third portion. The source region and the drain region are positioned in the polysilicon layer under the fourth portion. The channel region is positioned in the polysilicon layer under the gate layer. The LDD region is positioned in the polysilicon layer under the third portion and is between the channel region and the source region or between the channel region and the drain region.

23 Claims, 16 Drawing Sheets

THIN FILM TRANSISTOR AND METHOD FOR FABRICATING THE SAME

BACKGROUND OF THE INVENTION

1. Field of the Invention

The present invention relates to a semiconductor device and a method for fabricating the same, and more particularly, to a thin film transistor and a method for fabricating the same.

2. Description of Related Art

In a device, a switch is formed for controlling the operation of the device. As to an active display device, a thin film transistor (TFT) is generally made as a switch. Based on the material of the channel of thin film transistors, there are two types of TFT: amorphous silicon (a-Si) thin film transistor and polysilicon thin film transistor. A polysilicon thin film transistor has lower consuming power and higher electromigration than an amorphous silicon thin film transistor. The polysilicon thin film transistor receives increasing attention in the market after laser technology is employed for fabricating the polysilicon thin film transistor under 600 centigrade degrees.

FIG. 1 is a schematic cross-sectional drawing of a conventional thin film transistor. Referring to FIG. 1, after a buffer layer 102 is formed on a substrate 100, a polysilicon layer 104 and a gate dielectric layer 106 are sequentially formed over the buffer layer 102. A gate layer 108 is formed on the gate dielectric layer 106. Thereafter, a source region 1110a and a drain region 110b are formed using a doping method with a doping mask. A channel region 112 is formed under the gate layer 108. Leakage current and hot carrier effect can be avoided by forming lightly-doped-drain (LDD) regions 114a and 114b between the source region 110a and the channel region 112 and between the drain region 110b and the channel region 112. A source conductive layer 118a and a drain conductive layer 118b passing through the gate dielectric layer 106 and a dielectric layer 116 are electrically connected to the source region 110a and the drain region 110b, respectively.

In the above process, leakage current and hot carrier effect can be mitigated by the lightly-doped-drain (LDD) regions that are formed using an extra ion implanting process with an extra doping mask. In other words, the source region/drain region and the lightly-doped-drain (LDD) regions are formed using two steps of the ion implanting process with two different doping masks formed by different masking processes. Therefore, the process for fabricating the thin film transistor with the lightly-doped-drain (LDD) regions is complicated and time-consuming. The mismatch of the positioning of the different doping masks is resulted during the fabrication of the thin film transistor.

SUMMARY OF THE INVENTION

Accordingly, one object of the present invention is to provide a process for fabricating the thin film transistor with reduced processing steps.

Accordingly, one object of the present invention is to provide a thin film transistor with improved leakage current and hot carrier effect.

To achieve these and other advantages and in accordance with the purpose of the invention, the present invention provides a method for fabricating the thin film transistor. A polysilicon layer and a gate dielectric layer are sequentially formed over a substrate. A patterned photoresist mask having a first portion and a second portion is formed over the gate dielectric layer, wherein the second portion has a thickness smaller than that of the first portion. The gate dielectric layer is patterned using an etching process with the patterned photoresist mask acting as an etching mask. The patterned gate dielectric layer has a third portion and a fourth portion, wherein the fourth portion is positioned at two sides of the third portion and has a thickness smaller than that of the third portion. An ion implanting process is performed with the patterned photoresist mask and the patterned gate dielectric layer acting as a doping mask to form a source region and a drain region in the polysilicon layer under the fourth portion of the patterned gate dielectric layer and to form a lightly-doped-drain (LDD) region in the polysilicon layer under the third portion of the patterned gate dielectric layer. A channel region is positioned in the polysilicon layer under the third portion of the patterned gate dielectric layer, wherein the lightly-doped-drain (LDD) region is positioned between the channel region and the source region or between the channel region and the drain region. Thereafter, the patterned photoresist mask is removed and then a gate layer is formed over the gate dielectric layer over the channel region.

To achieve these and other advantages and in accordance with the purpose of the invention, the present invention provides a process for fabricating the thin film transistor. A polysilicon layer, a gate dielectric layer and a gate layer are sequentially formed over a substrate. A patterned photoresist mask having a first portion and a second portion is formed over the gate layer, wherein the first portion has a thickness smaller than that of the second portion. The gate layer and the gate dielectric layer are patterned using an etching process with the patterned photoresist mask acting as an etching mask. The patterned gate dielectric layer has a third portion and a fourth portion, wherein the fourth portion is positioned at two sides of the third portion and has a thickness smaller than that of the third portion. Thereafter, the patterned phosotresist mask is removed. An ion implanting process is performed with the patterned gate dielectric layer acting as a doping mask to form a source region and a drain region in the polysilicon layer under the fourth portion of the patterned gate dielectric layer and to form a lightly-doped-drain (LDD) region in the polysilicon layer under the third portion of the patterned gate dielectric layer. A channel region is positioned in the polysilicon layer under the third portion of the patterned gate layer, wherein the lightly-doped-drain (LDD) region is positioned between the channel region and the source region or between the channel region and the drain region. The above patterned photoresist layer can be removed after the ion implantation process.

To achieve these and other advantages and in accordance with the purpose of the invention, the present invention provides a thin film transistor. The thin film transistor comprises a substrate, a polysilicon layer, a patterned gate dielectric layer, a gate layer, a channel region, a source region, a drain region, and a lightly-doped-drain (LDD) region. The polysilicon layer is positioned over the substrate. The patterned gate dielectric layer is positioned over the polysilicon layer. The patterned gate dielectric layer has a third portion and a fourth portion, wherein the fourth portion has a thickness smaller than that of the third portion. The gate layer is positioned over the third portion of the patterned gate dielectric layer. The source region and the drain region are positioned in the polysilicon layer under the fourth portion of the patterned gate dielectric layer. The channel region is positioned in the polysilicon layer under the gate layer. The lightly-doped-drain (LDD) region is positioned in the polysilicon layer under the third portion of the patterned gate dielectric layer between the channel region and the source region or between the channel region and the drain region.

The source region/drain region and the lightly-doped-drain (LDD) regions are formed by performing only one step of the ion implanting process with only one patterned gate dielectric layer and only one patterned photoresist mask acting as a doping mask. Therefore, the method for fabricating a thin film transistor according to the present invention is efficient. The mismatch of positioning two different doping masks, frequently occurred in the prior art, can be avoided.

To achieve these and other advantages and in accordance with the purpose of the invention, the present invention provides a process for fabricating the thin film transistor. A polysilicon layer, a gate dielectric layer and a gate layer are sequentially formed over a substrate. A patterned photoresist mask having a first portion and a second portion is formed over the gate layer, wherein the first portion has a thickness smaller than that of the second portion. The gate layer is patterned using an etching process with the patterned photoresist mask acting as an etching mask. The patterned gate layer has a fifth portion and a sixth portion, wherein the sixth portion has a thickness smaller than that of the fifth portion. Thereafter, the patterned photoresist layer is removed. A first ion implanting process for doping a source region and a drain region in the polysilicon layer is performed with the patterned photoresist mask and the patterned gate layer acting as a doping mask. Thereafter, the sixth portion of the patterned gate layer is removed. A second ion implanting process for doping the source region, the drain region and a lightly-doped-drain (LDD) region in the polysilicon layer is performed with the remaining patterned photoresist mask and the remaining patterned gate layer acting as a doping mask. A channel region is positioned in the polysilicon layer under the remaining patterned gate layer, wherein the lightly-doped-drain (LDD) region is positioned between the channel region and the source region or between the channel region and the drain region. Thereafter, the patterned photoresist mask is removed. Further, the above patterned photoresist layer can be removed after the second ion implantation process.

The source region/drain region and the lightly-doped-drain (LDD) regions are formed by performing only one step of the photolithography process. Therefore, the method for fabricating a thin film transistor according to the present invention is efficient. The mismatch of the positioning of two different doping masks as often occurred in the prior art, can be avoided.

One or part or all of these and other features and advantages of the present invention will become readily apparent to those skilled in this art from the following description wherein there is shown and described a preferred embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE ILLUSTRATED EMBODIMENTS

Various specific embodiments of the present invention are disclosed below, illustrating examples of various possible implementations of the concepts of the present invention. The following description is made for the purpose of illustrating the general principles of the invention and should not be taken in a limiting sense. The scope of the invention is best determined by reference to the appended claims.

First Embodiment

Figure 1:
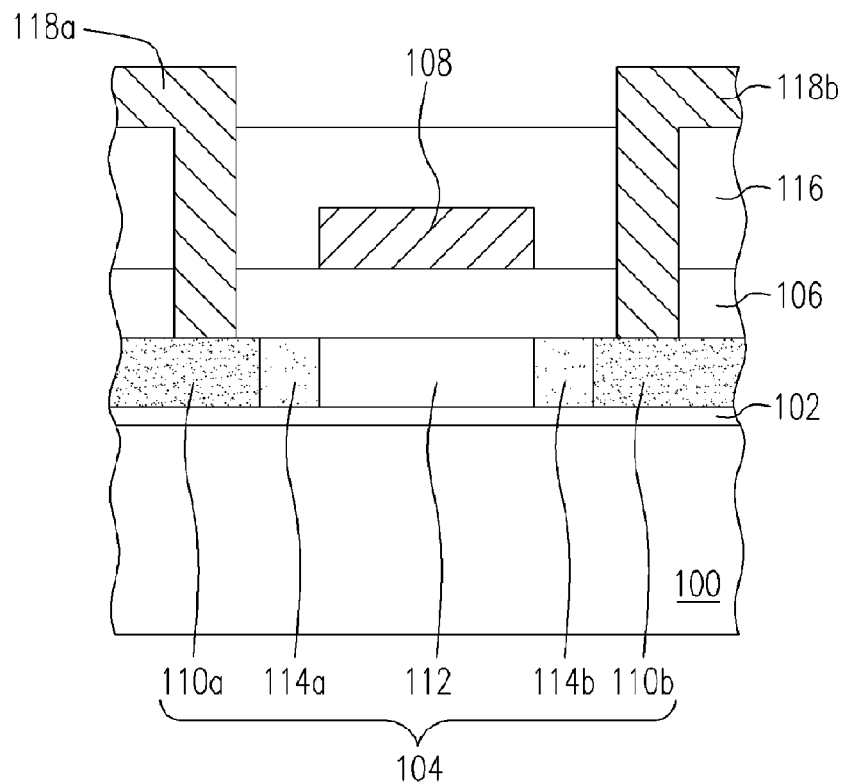
FIG. 1 is a schematic cross-sectional view of a conventional thin film transistor.
Figure 2A:
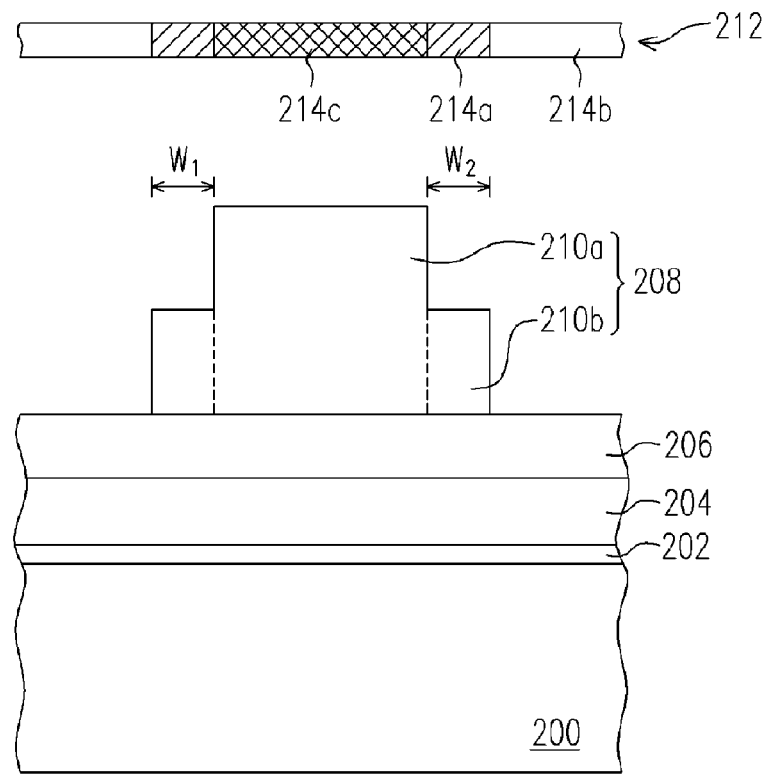
FIGS. 2A–2C are schematic cross-sectional views of a thin film transistor showing the steps a thin film transistor according to a first embodiment of the present invention.
Figure 2B:
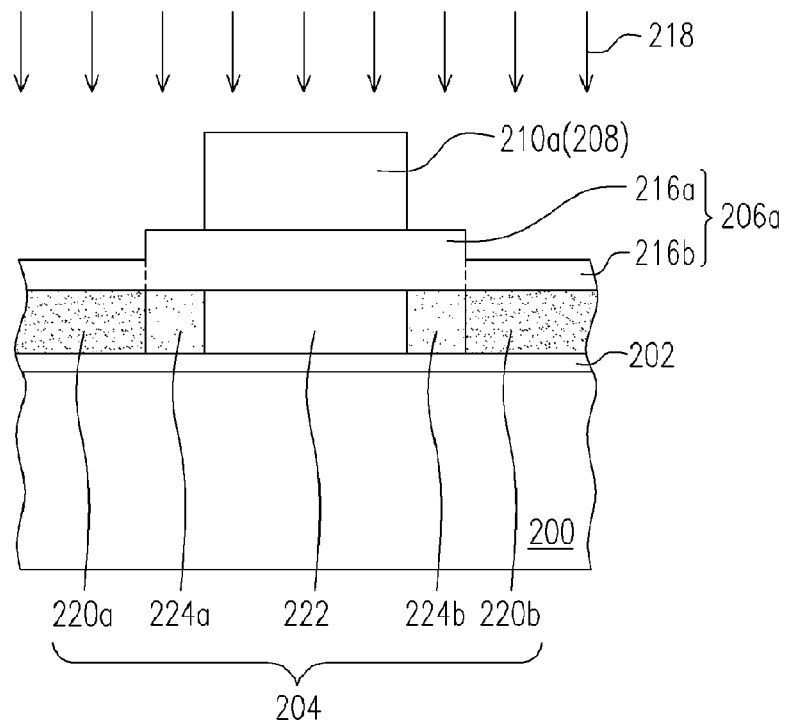
Figure 2C:
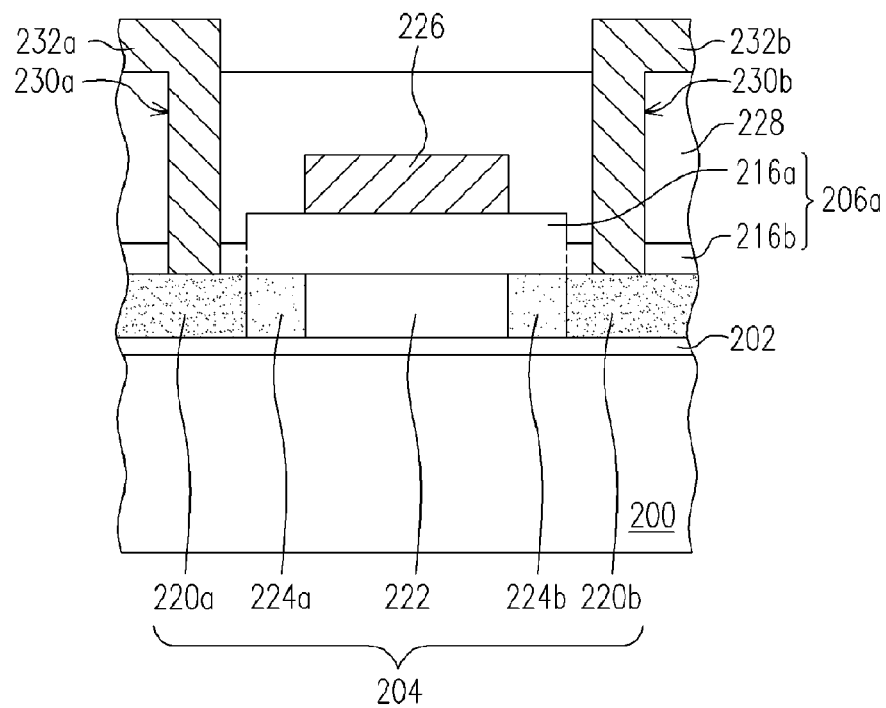

FIGS. 2A–2C are schematic cross-sectional views of a thin film transistor showing the steps for fabricating a thin film transistor according to a first embodiment of the present invention.

Referring to FIG. 2A, a polysilicon layer 204 and a gate dielectric layer 206 are sequentially formed over a substrate 200. The substrate 200 may be made of a transparent material, such as glass. The process for forming the polysilicon layer 204 includes forming an amorphous silicon layer (not shown) on the substrate 206, melting the amorphous silicon layer by an excimer-laser annealing (ELA) process, and then recrystallize the melted silicon layer. The gate dielectric layer 206 made of silicon oxide, silicon nitride, or silicon oxynitride, for example, can be formed using a chemical-vapor-deposition process. Alternatively, a buffer layer 202 made of silicon oxide, for example, can be formed over the substrate 200 before forming the polysilicon layer 204.

A patterned photoresist mask 208 having a first portion 210a and a second portion 210b is formed over the gate dielectric layer 206. The second portion 210b is positioned at two sides of the first portion 210a and has a thickness smaller than that of the first portion 210a. The process of forming patterned photoresist mask 208 may include the following steps. First, an original photoresist layer (not shown) is formed over the gate dielectric layer 206. The original photoresist layer, such as positive photoresist, can be exposed to light with a mask 212 having a semi-transparent region 214a, a transparent region 214b and a light-blocking region 214c. Afterwards, the original photoresist layer can be developed to form the patterned photoresist mask 208 having the first portion 210a and the second portion 210b. During exposing, the first portion 210a is aligned with the light-blocking region 214c of the mask 212, and the second portion 210b is aligned with the semi-transparent region 214a of the mask 212. The original photoresist layer that is aligned with the transparent region 214b during exposing can be completely removed during developing.

Referring to 2B, the gate dielectric layer 206a is patterned using an etching process with the patterned photoresist mask 208 acting as an etching mask. The patterned gate dielectric layer 206a has a third portion 216a and a fourth portion 216b, wherein the fourth portion 216b is positioned at two sides of the third portion 216a and has a thickness smaller than that of the third portion 216a. The gate dielectric layer 206 not covered by the patterned photoresist mask 208, during etching, can be partially removed to create the fourth portion 216b. The gate dielectric layer 206 covered by the second portion 210b of the patterned photoresist mask 208, during etching, can be retained or slightly removed and can be exposed thereafter. The gate dielectric layer 206 covered by the first portion 210a of the patterned photoresist mask 208, is not removed during etching.

An ion implanting process 218 is performed with the patterned photoresist mask 208 and the patterned gate dielectric layer 206a acting as a doping mask to form a source region 220a and a drain region 220b in the polysilicon layer 204 under the fourth portion 216b of the patterned gate dielectric layer 206a and to form lightly-doped-drain (LDD) regions 224a and 224b in the polysilicon layer 204 under the third portion 216a of the patterned gate dielectric layer 206a. A channel region 222 is configured in the polysilicon layer 204 under the third portion 216a of the patterned gate dielectric layer 206a, wherein the lightly-doped-drain (LDD) regions 224a and 224b are configured between the channel region 222 and the source region 220a and between the channel region 222 and the drain region 220b. After performing only one step of the ion implanting process 218, the regions with different dopant concentrations can be produced due to the patterned gate dielectric layer 206a having different thicknesses. The channel region 222 is defined under the thickest portion of the doping mask which includes the third portion 216a of the patterned gate dielectric layer 206a and the patterned photoresist mask 208. The lightly-doped-drain (LDD) regions 224a and 224b can be formed under the second thickness portion of the doping mask which includes the third portion 216a of the patterned gate dielectric layer 206a. The source region 220a and the drain region 220b can be formed under the thinnest portion of the doping mask which includes the fourth portion 216b of the patterned gate dielectric layer 206a.

In one embodiment, under the condition that the gate dielectric layer 206 as shown in FIG. 2A is formed with a thickness of 1000 angstroms, and n-type dopants 218 such as phosphorous atoms are doped with a dopant concentration ranging from $1*10^{14}$ to $1*10^{16}$ atoms per square centimeter for fabricating a n-type polysilicon thin film transistor, the ion implanting process may provide a doping energy of 70 keV to 80 KeV, for example.

Thereafter, the patterned photoresist mask 208 is removed as shown in FIG. 2C and then a gate layer 226 is formed over the patterned gate dielectric layer 206a over the channel region 222.

After the gate layer 226 is formed, a drain conductive layer and a source conductive layer will be formed. The detail will be described in the following. A dielectric layer 228 is formed over the substrate 200 and covers the gate layer 226 and the patterned gate dielectric layer 206a. A source plug opening 230a and a drain plug opening 230b are formed passing through the dielectric layer 228 and the patterned gate dielectric layer 206a and exposing the source region 220a and the drain region 220b. Afterwards, a conductive layer including a source conductive layer 232a and a drain conductive layer 232b is formed over the dielectric layer 228 and in the source plug opening 230a and the drain plug opening 230b. The source conductive layer 232a is electrically connected to the source region 220a. The drain conductive layer 232b is electrically connected to the drain region 220b.

Figure 3A:
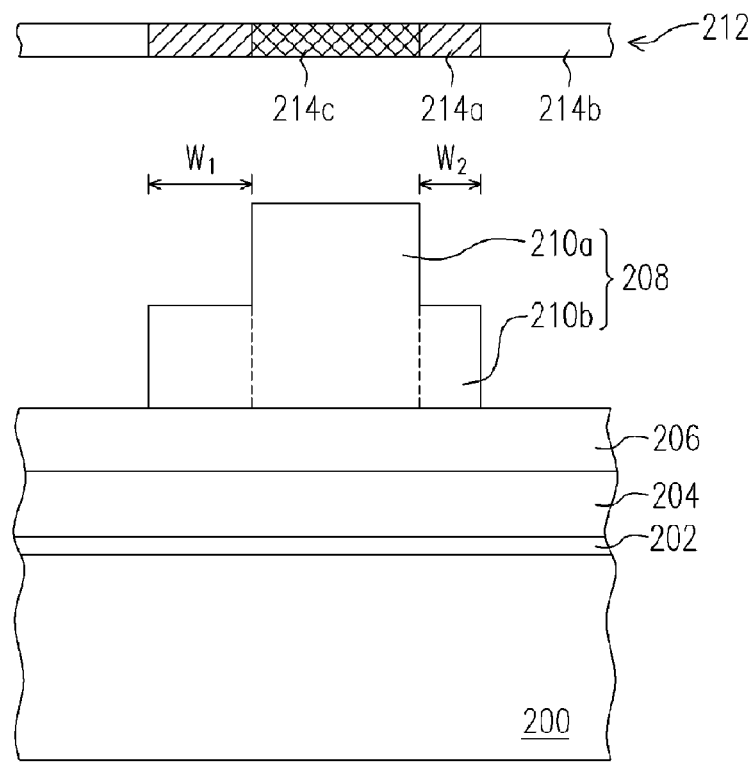
FIGS. 3A–3B are schematic cross-sectional views of a thin film transistor showing the steps for fabricating another thin film transistor according to the first embodiment of the present invention.
Figure 3B:
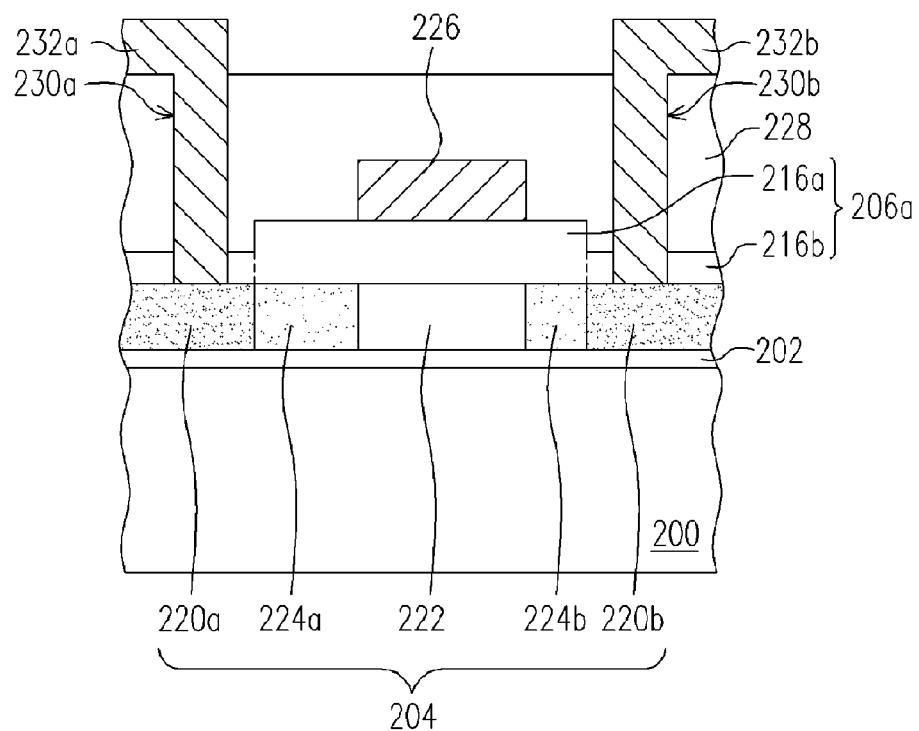
Figure 4A:
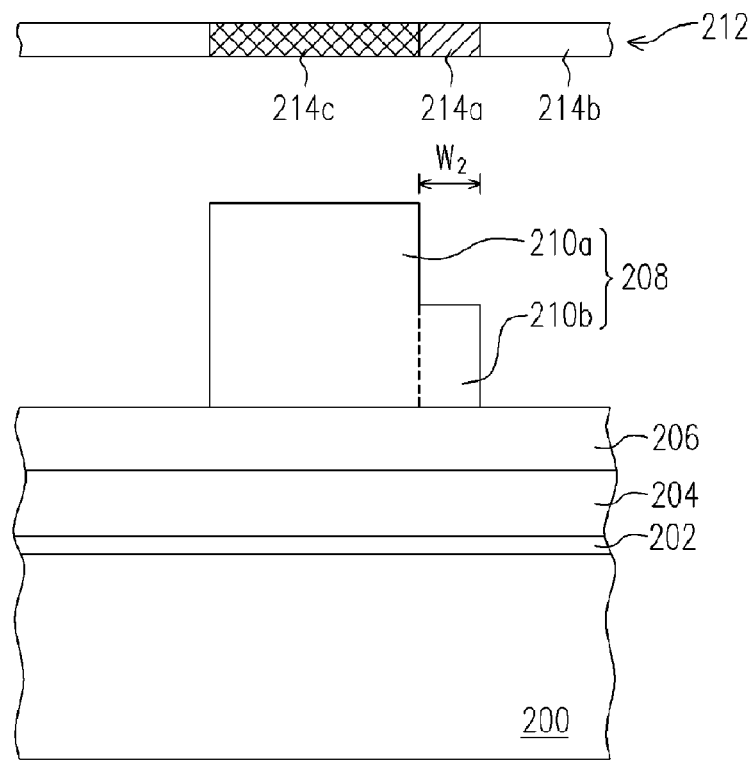
FIGS. 4A–4B are schematic cross-sectional views of a thin film transistor showing the steps for fabricating another thin film transistor according to the first embodiment of the present invention.
Figure 4B:
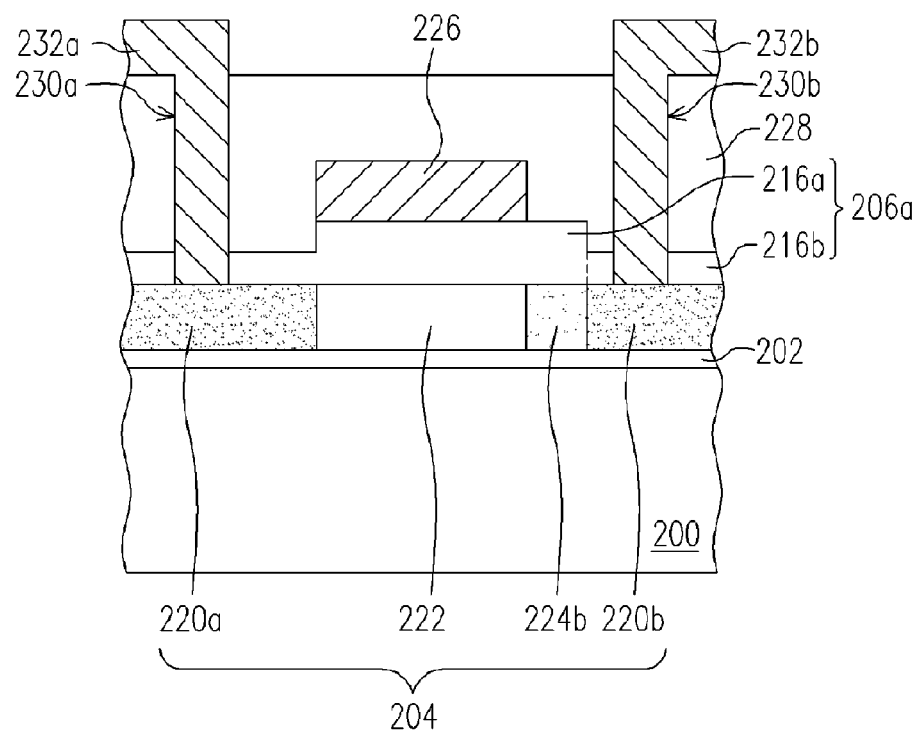

The widths w1 and w2 of the second portion 210b at two sides of the first portion 210a of the patterned photoresist mask 208 are equivalent as shown in FIG. 2A, but, alternatively, they can be different in practice. Referring to FIG. 3A, the widths w1 and w2 of the second portion 210b at two sides of the first portion 210a of the patterned photoresist mask 208 are different. Therefore, as shown in FIG. 3B, asymmetric lightly-doped-drain (LDD) regions 224a and 224b with different widths are formed after the steps of etching the gate dielectric layer 206 and implanting ions. Besides, referring to FIG. 4A, the second portion 210b is positioned at only one side of the first portion 210a of the patterned photoresist mask 208. Accordingly, as shown in FIG. 4B, only one lightly-doped-drain (LDD) region 224b is formed after the steps of etching the gate dielectric layer 206 and implanting ions.

Figure 5A:
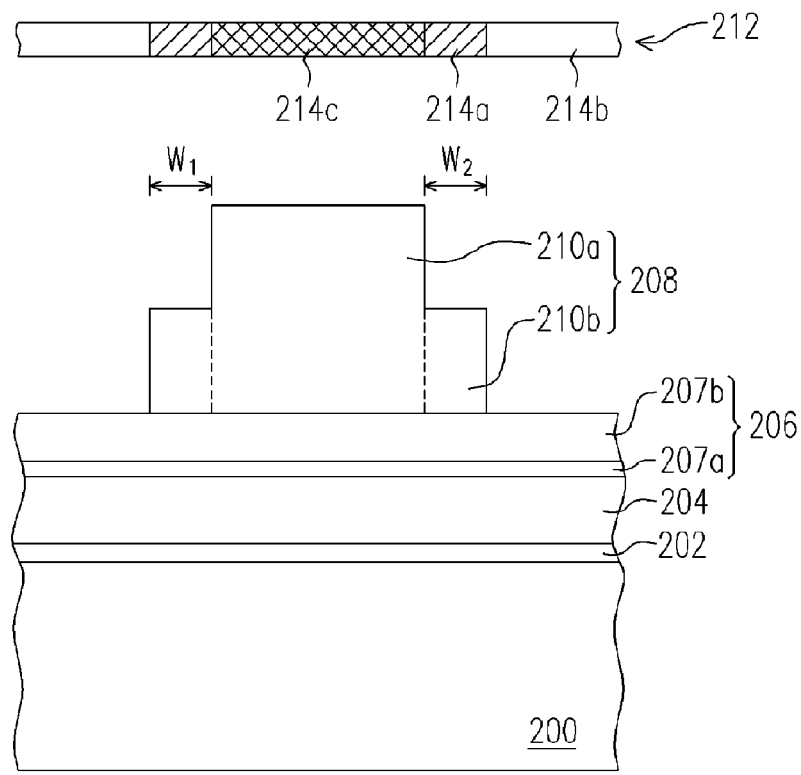
FIGS. 5A–5B are schematic cross-sectional views of a thin film transistor showing the steps for fabricating another thin film transistor according to the first embodiment of the present invention.
Figure 5B:
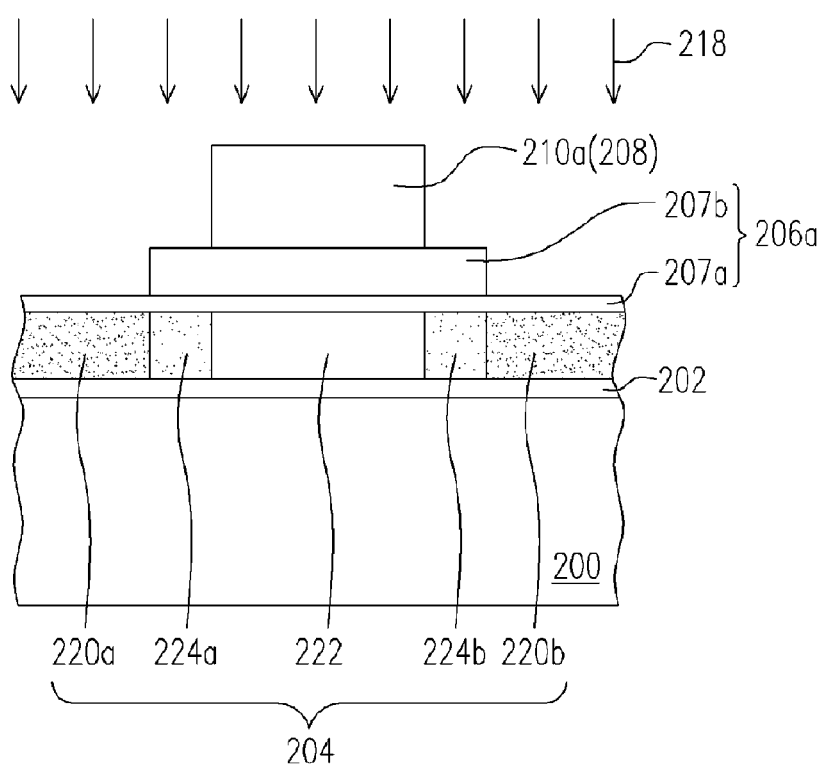

Alternatively, referring to FIG. 5A, the gate dielectric layer 206 positioned over the polysilicon layer 204 can be formed from two layers 207a and 207b of gate dielectric material, wherein the two layers 207a and 207b may have different materials or a same material. In the step of patterning the gate dielectric layer 206, the gate dielectric layer 207b not covered by the patterned photoresist layer 208 is partially etched until the gate dielectric layer 207a is exposed, as shown in FIG. 5B.

Second Embodiment

In the following embodiment, the explanation for the elements having the same reference numbers recited in the above embodiment will be omitted.

FIGS. 6A–6D are schematic cross-sectional views of a thin film transistor showing the steps for fabricating a thin film transistor according to a second embodiment of the present invention.

Figure 6A:
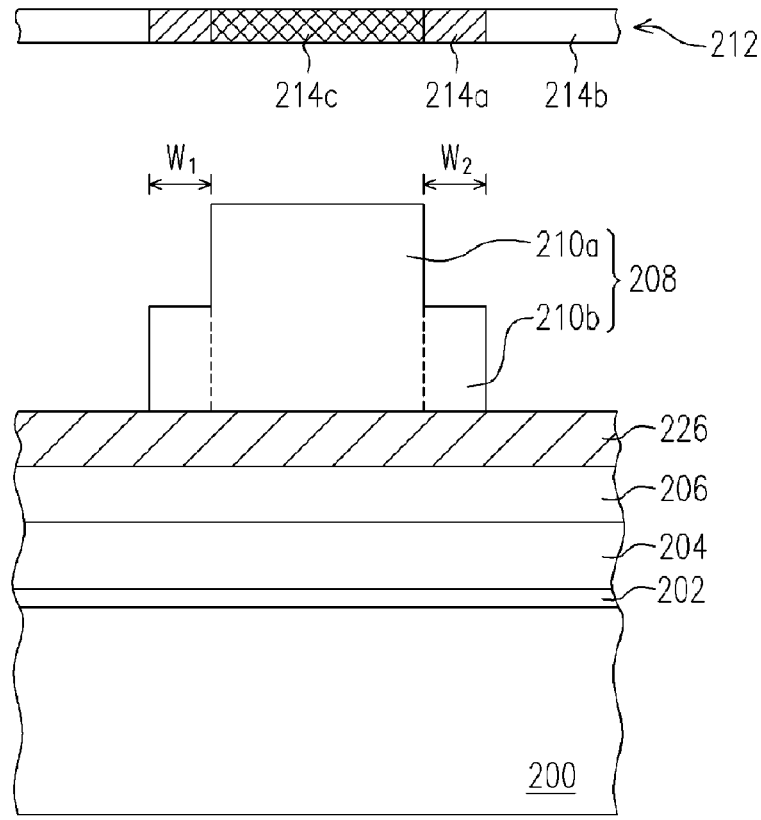
FIGS. 6A–6D are schematic cross-sectional views of a thin film transistor showing the steps for fabricating a thin film transistor according to a second embodiment of the present invention.
Figure 6B:
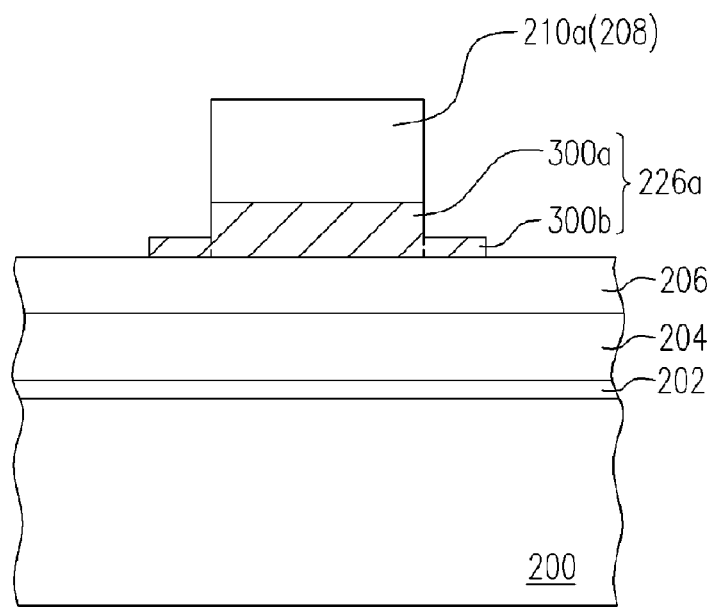

Referring to FIG. 6A, a polysilicon layer 204, a gate dielectric layer 206 and a gate layer 226 are sequentially formed over a substrate 200. Alternatively, a buffer layer 202 can be formed over the substrate 200 before forming the polysilicon layer 204.

A patterned photoresist mask 208 having a first portion 210a and a second portion 210b is formed over the gate layer 226. The second portion 210b is positioned at two sides of the first portion 210a and has a thickness smaller than that of the first portion 210a. The process of forming patterned photoresist mask 208 may include the following steps. First, an original photoresist layer (not shown) is formed over the gate dielectric layer 206. The original photoresist layer, such as positive photoresist, can be exposed to light with a mask 212 having a semi-transparent region 214a, a transparent region 214b and a light-blocking region 214c. Afterwards, the original photoresist layer can be developed to form the patterned photoresist mask 208 having the first portion 210a and the second portion 210b. During exposing, the first portion 210a is aligned with the light-blocking region 214c of the mask 212, and the second portion 210b is aligned with the semi-transparent region 214a of the mask 212. The original photoresist layer that is aligned with the transparent region 214b during exposing can be completely removed during developing.

Referring to 6B, the gate layer 226a is patterned using an etching process with the patterned photoresist mask 208 acting as an etching mask. The patterned gate layer 226a has a fifth portion 300a and a sixth portion 300b, wherein the sixth portion 300b is positioned at two sides of the fifth portion 300a and has a thickness smaller than that of the fifth portion 300a. The gate layer 226 not covered by the patterned photoresist mask 208, during etching, can be completely removed. The gate layer 226 covered by the second portion 210b of the patterned photoresist mask 208, during etching, can be partially removed to create the sixth portion 300b. The gate layer 226 covered by the first portion 210a of the patterned photoresist mask 208, during etching, is not removed.

Figure 6C:
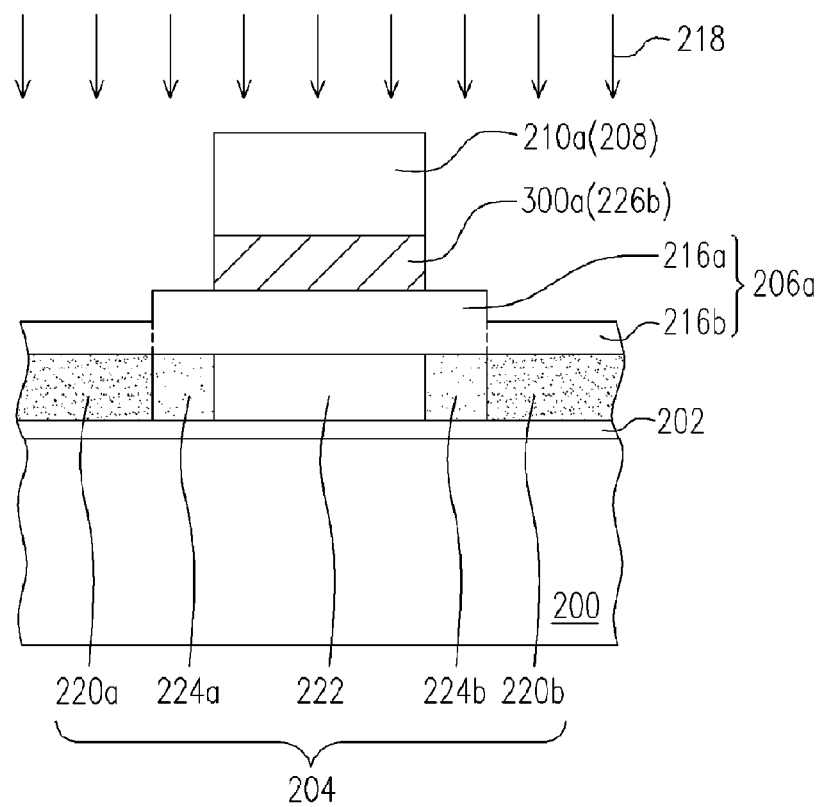

Thereafter, referring to FIG. 6C, the gate dielectric layer 206a is patterned using an etching process with the patterned photoresist mask 208 and the patterned gate layer 226a acting as an etching mask. During the step of etching gate dielectric layer 206, the sixth portion 300b of the patterned gate layer 226a is being removed. The patterned gate dielectric layer 206a has a third portion 216a and a fourth portion 216b, wherein the fourth portion 216b is positioned at two sides of the third portion 216a and has a thickness smaller than that of the third portion 216a. The gate dielectric layer 206 not covered by the patterned gate layer 226a, during etching, can be partially removed to create the fourth portion 216b. The gate dielectric layer 206 covered by the sixth portion 300b of the patterned gate layer 226a, during etching, can be retained or slightly removed and is exposed thereafter. The gate dielectric layer 206 covered by the fifth portion 300a of the patterned gate layer 226a, during etching, is not removed.

An ion implanting process is performed with the patterned photoresist mask 208, the patterned gate layer 226b and the patterned gate dielectric layer 206a acting as a doping mask to form a source region 220a and a drain region 220b in the polysilicon layer 204 under the fourth portion 216b of the patterned gate dielectric layer 206a and to form lightly-doped-drain (LDD) regions 224a and 224b in the polysilicon layer 204 under the third portion 216a of the patterned gate dielectric layer 206a. A channel region 222 is configured in the polysilicon layer 204 under the patterned gate layer 226b, wherein the lightly-doped-drain (LDD) regions 224a and 224b are positioned between the channel region 222 and the source region 220a and between the channel region 222 and the drain region 220b.

Figure 6D:
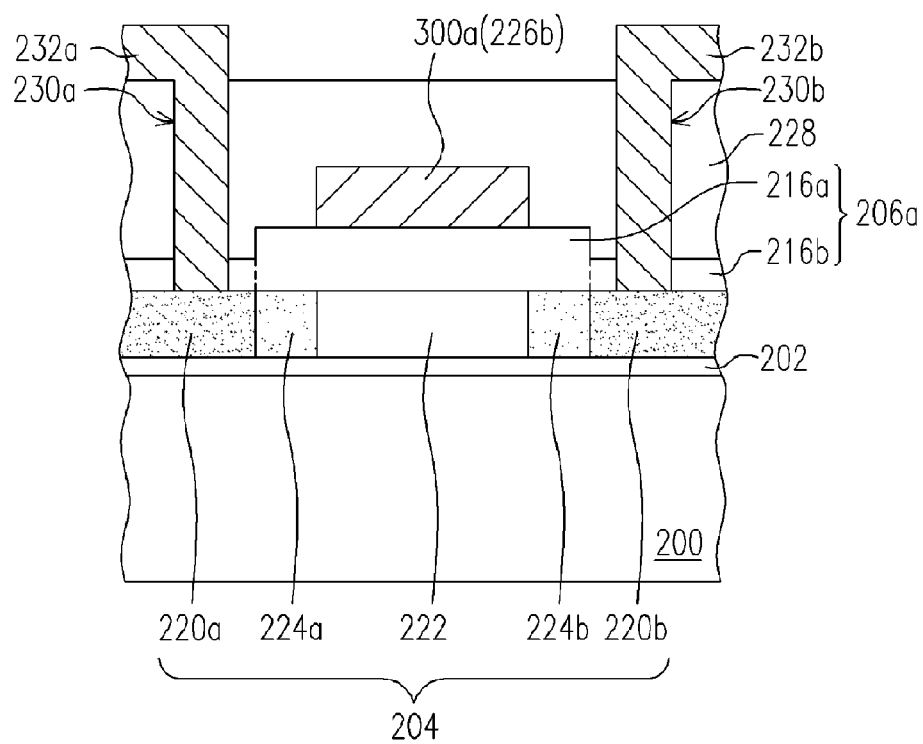

Thereafter, as shown in FIG. 6D, the patterned photoresist mask 208 is removed. In one embodiment, the removal of the patterned photoresist layer 208 can be conducted after the patterning of the gate dielectric layer 206a and before the ion implantation process. Further, in another embodiment, a drain conductive layer and a source conductive layer are formed after the removal of the patterned photoresist layer 208. The detail will be described in the following. After the patterned photoresist mask 208 is removed, a dielectric layer 228 is formed over the substrate 200 and covers the gate layer 226 and the patterned gate dielectric layer 206a. A source plug opening 230a and a drain plug opening 230b are formed passing through the dielectric layer 228 and the patterned gate dielectric layer 206a and exposing the source region 220a and the drain region 220b. Afterwards, a conductive layer including a source conductive layer 232a and a drain conductive layer 232b is formed over the dielectric layer 228 and in the source plug opening 230a and the drain plug opening 230b. The source conductive layer 232a is electrically connected to the source region 220a. The drain conductive layer 232b is electrically connected to the drain region 220b.

Figure 7A:
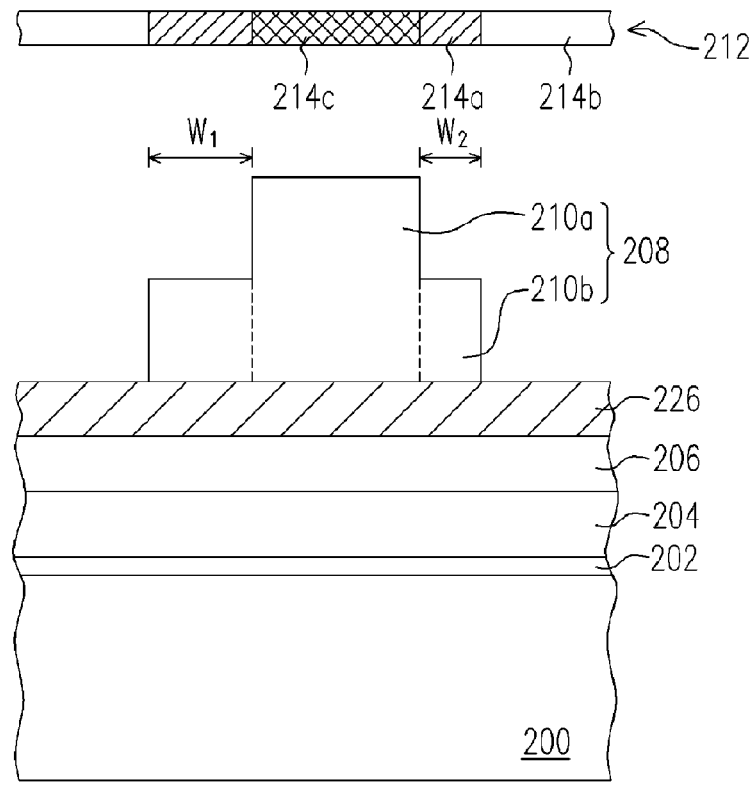
FIGS. 7A–7B are schematic cross-sectional views of a thin film transistor showing the steps for fabricating another thin film transistor according to the second embodiment of the present invention.
Figure 7B:
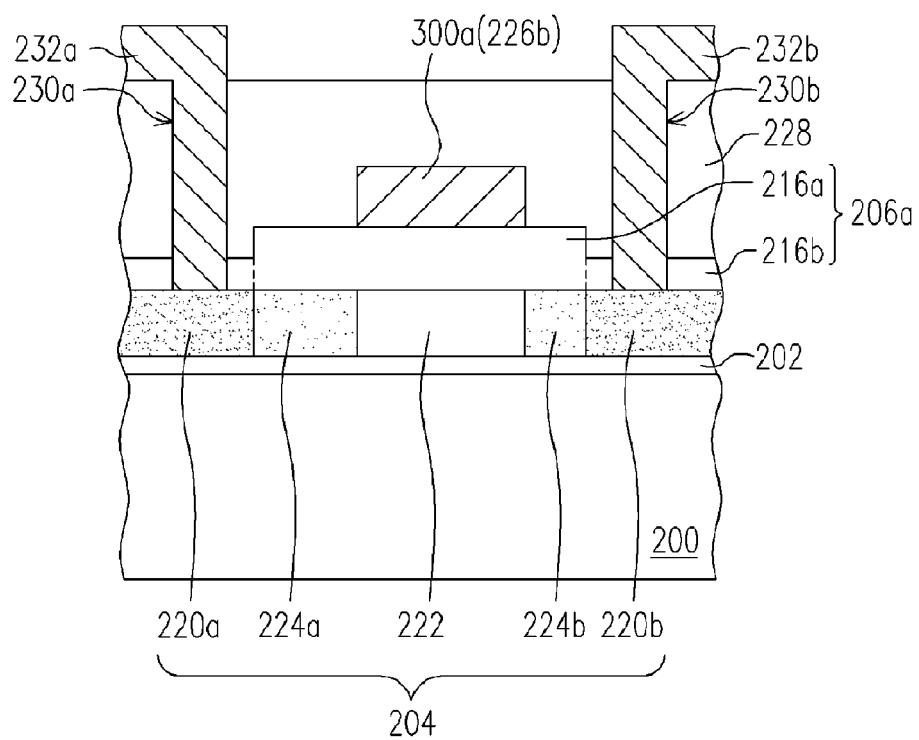
Figure 8A:
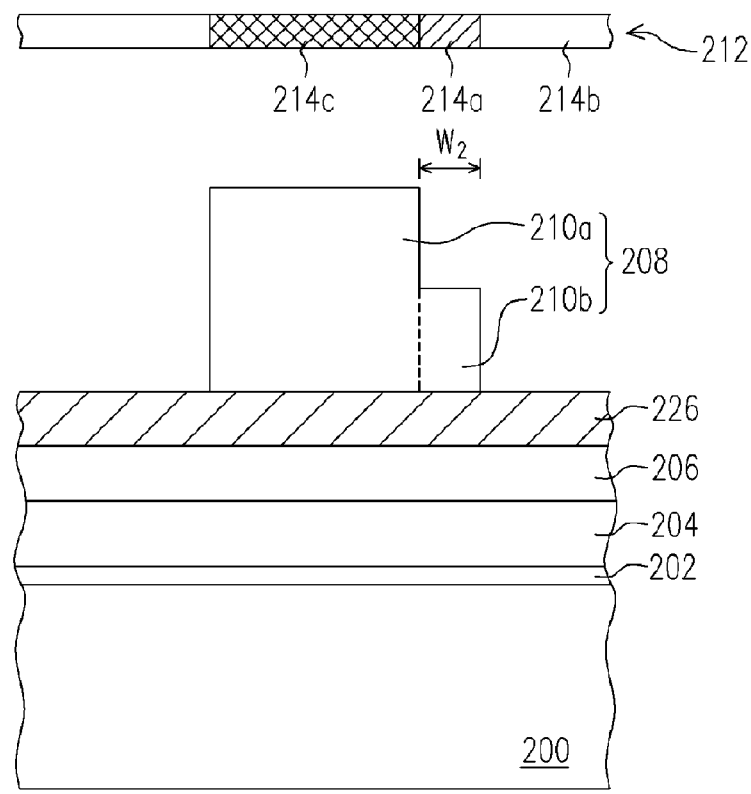
FIGS. 8A–8B are schematic cross-sectional views of a thin film transistor showing the steps for fabricating another thin film transistor according to the second embodiment of the present invention.
Figure 8B:
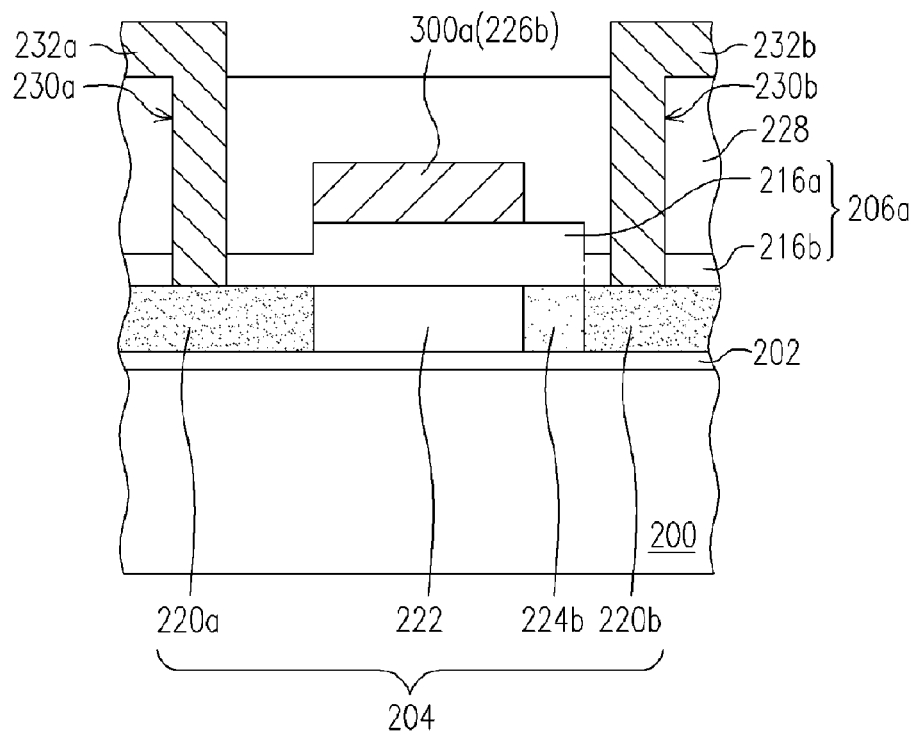

The widths w1 and w2 of the second portion 210b at two sides of the first portion 210a of the patterned photoresist mask 208 are equivalent as shown in FIG. 6A, but, alternatively, they can be different in practice. Referring to FIG. 7A, the widths w1 and w2 of the second portion 210b at two sides of the first portion 210a of the patterned photoresist mask 208 are different. Therefore, as shown in FIG. 7B, asymmetric lightly-doped-drain (LDD) regions 224a and 224b with different widths are formed after the steps of etching the gate dielectric layer 206 and implanting ions. Besides, referring to FIG. 8A, the second portion 210b is positioned at only one side of the first portion 210a of the patterned photoresist mask 208. Accordingly, as shown in FIG. 8B, only one lightly-doped-drain (LDD) region 224b can be formed after the steps of etching the gate dielectric layer 206 and implanting ions.

Figure 9A:
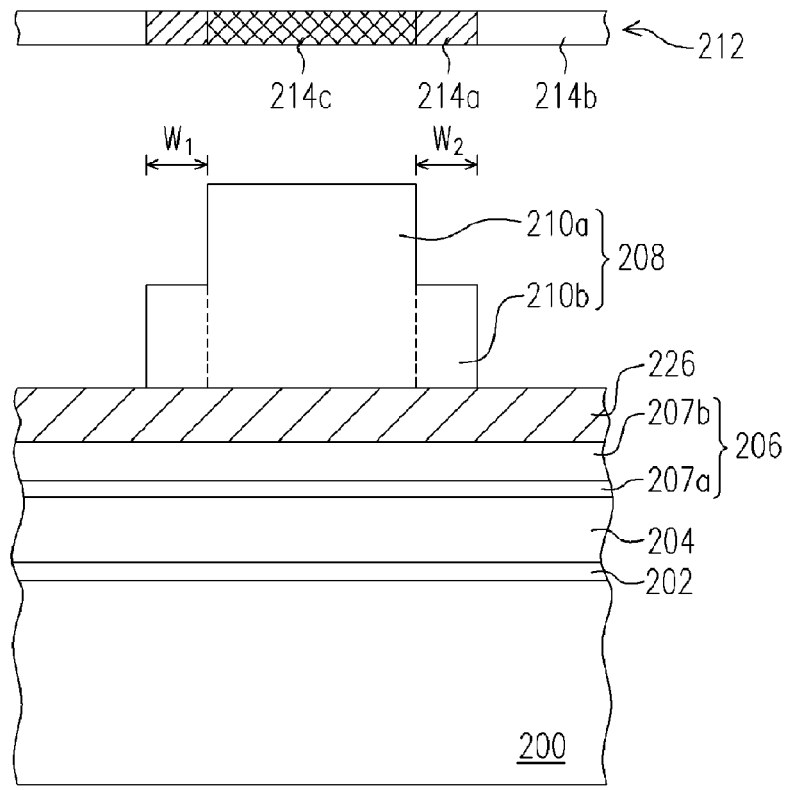
FIGS. 9A–9B are schematic cross-sectional views of a thin film transistor showing the steps for fabricating another thin film transistor according to the second embodiment of the present invention.
Figure 9B:
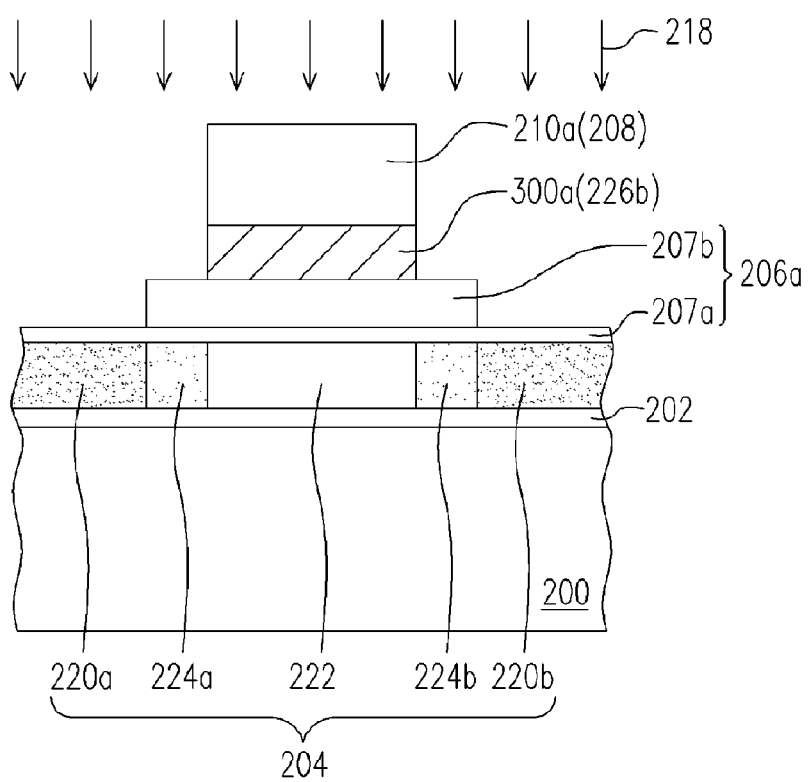

Alternatively, referring to FIG. 9A, the gate dielectric layer 206 positioned over the polysilicon layer 204 can be formed from two layers 207a and 207b of gate dielectric material, wherein the two layers 207a and 207b may have different materials or a same material. In the step of patterning the gate dielectric layer 206, the gate dielectric layer 207b not covered by the patterned photoresist layer 208 is partially etched until the gate dielectric layer 207a is exposed, as shown in FIG. 9B.

Figure 10:
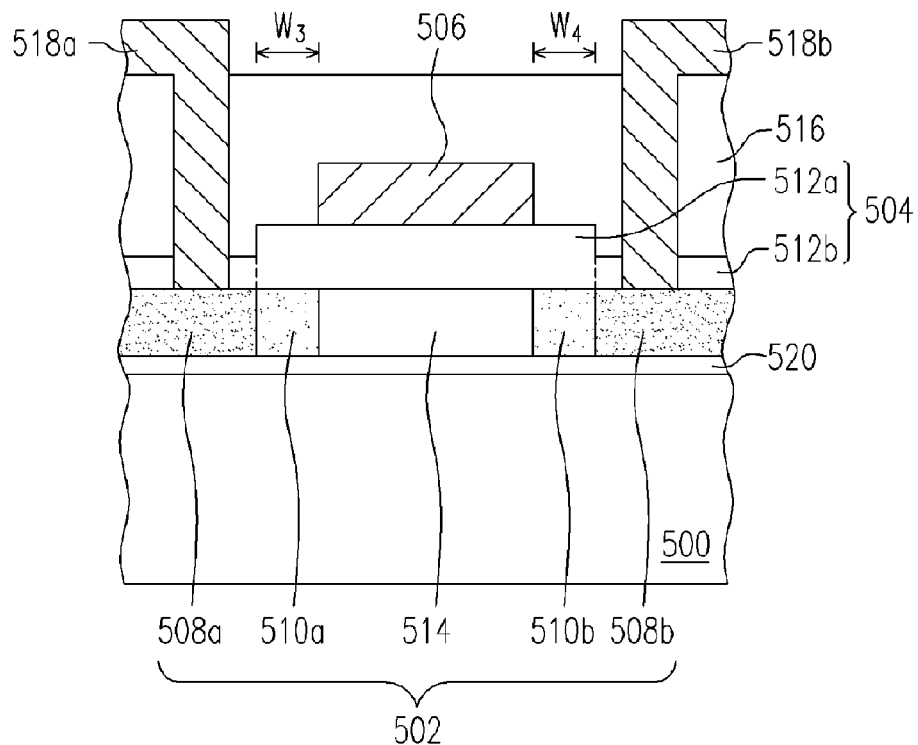
FIG. 10 is a schematic cross-sectional view of a thin film transistor according to an embodiment of the present invention.
Figure 11:
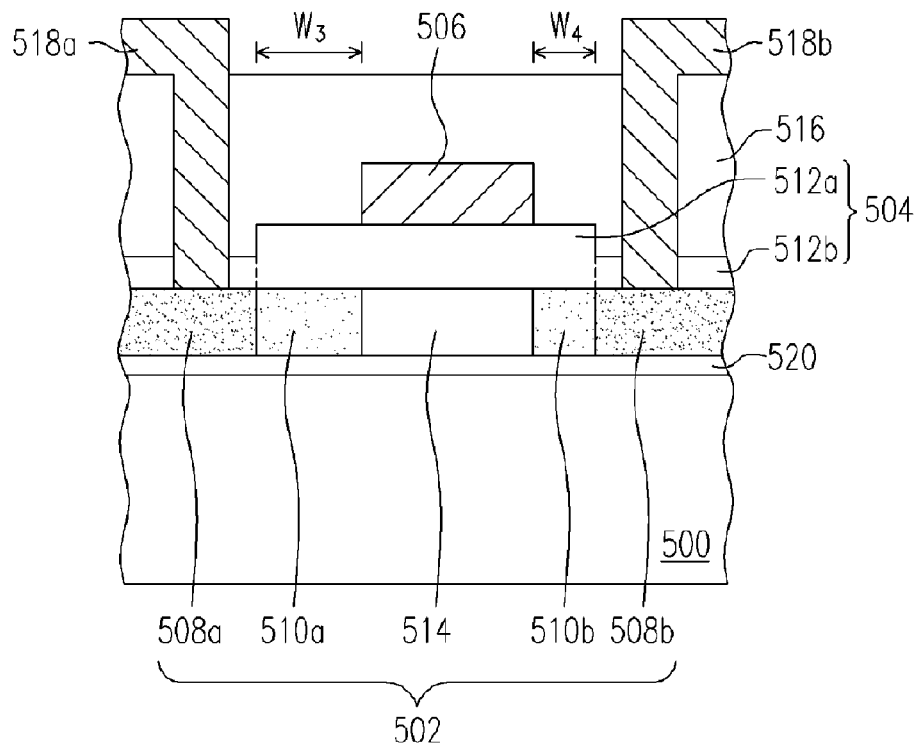
FIG. 11 is a schematic cross-sectional view of a thin film transistor according to another embodiment of the present invention.
Figure 12:
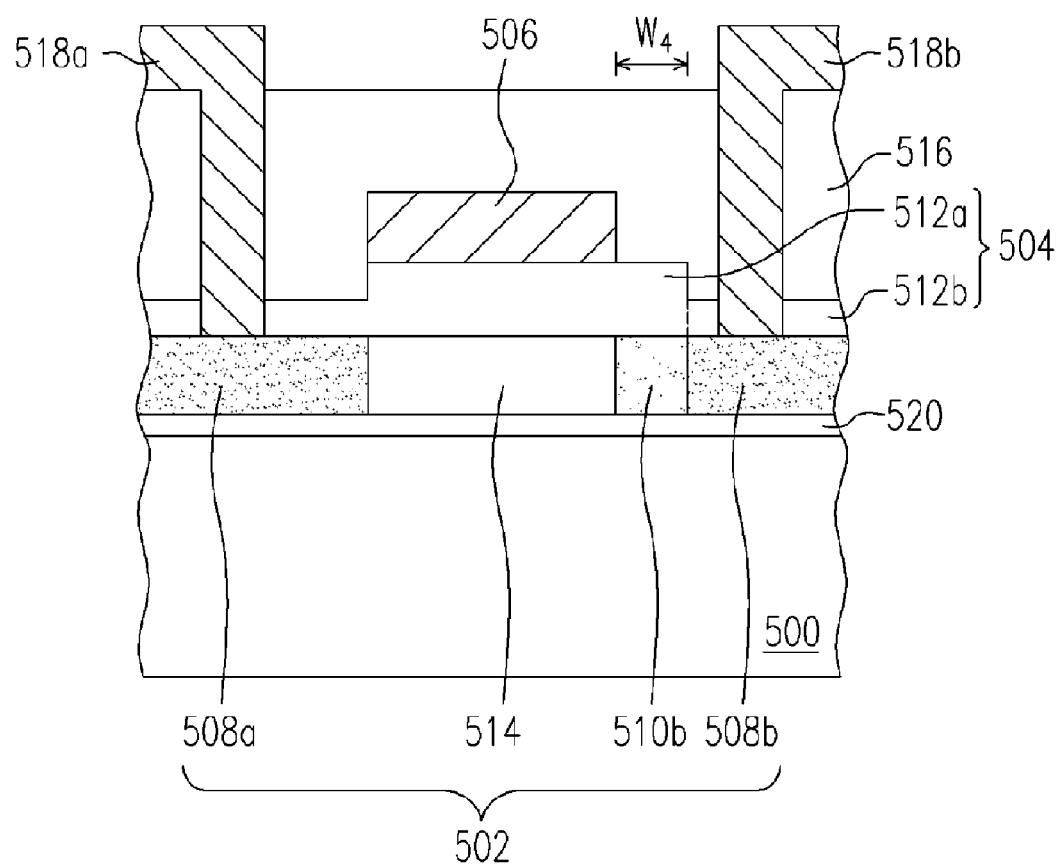
FIG. 12 is a schematic cross-sectional view of a thin film transistor according to another embodiment of the present invention.

The thin film transistor as shown in FIGS. 10, 11 and 12 can be fabricated employing the above first and second embodiments. The thin film transistor includes a substrate 500, a polysilicon layer 502, a patterned gate dielectric layer 504, a gate layer 506, a channel region 514, a source region 508a, a drain region 508b and lightly-doped-drain (LDD) regions 510a and 510b.

The polysilicon layer 502 is positioned over the substrate 500. The patterned gate dielectric layer 504 is positioned over the polysilicon layer 502. The patterned gate dielectric layer 504 has a third portion 512a and a fourth portion 512b, wherein the fourth portion 512b is positioned at two sides of the third portion 512a and has a thickness smaller than that of the third portion 512a.

The gate layer 506 is positioned over the third portion 512a of the patterned gate dielectric layer 504. The source region 508a and the drain region 508b are positioned in the polysilicon layer 502 under the fourth portion 512b of the patterned gate dielectric layer 504. The channel region 514 is positioned in the polysilicon layer 502 under the gate layer 506. The lightly-doped-drain (LDD) regions 510a and 510b are positioned in the polysilicon layer 502 under the third portion 504 of the patterned gate dielectric layer 504 between the channel region 514 and the source region 508a and between the channel region 514 and the drain region 508b.

The thin film transistor further includes a dielectric layer 516, a source conductive layer 518a and a drain conductive layer 518b. The dielectric layer 516 covers the gate layer 506 and the patterned gate dielectric layer 504. The source conductive layer 518a and the drain conductive layer 518b are deposited over the dielectric layer 516 and pass through the dielectric layer 516 and the patterned gate dielectric layer 504 for electrically connecting with the source region 508a and the drain region 508b, respectively.

Alternatively, the thin film transistor further includes a buffer layer 520 positioned between the substrate 500 and the polysilicon layer 502.

Referring to FIG. 10, the lightly-doped-drain (LDD) region 510a positioned between the channel region 514 and the source region 508a has a width w3 equivalent to the width w4 of the lightly-doped-drain (LDD) region 510b positioned between the channel region 514 and the drain region 508b. Alternatively, referring to FIG. 11, the width w3 of the lightly-doped-drain (LDD) region 510a positioned between the channel region 514 and the source region 508a is different from the width w4 of the lightly-doped-drain (LDD) region 510b positioned between the channel region 514 and the drain region 508b. Alternatively, referring to FIG. 12, one of the lightly-doped-drain (LDD) region 510a and 510b can be formed between the channel region 514 and the source region 508a or between the channel region 514 and the drain region 508b.

According to the above method of the present invention, only one step of the ion implanting process is performed to produce a source region, a drain region and lightly-doped-drain (LDD) regions with different dopant concentrations due to a patterned gate dielectric layer having different thicknesses. The patterned gate dielectric layer is formed by a single step of the photolithography process and then by a single step of the etching process. The photolithography process is performed to produce a patterned photoresist mask with different thicknesses by means of a mask having a semi-transparent region. Therefore, the method of the present invention is easier than the conventional method. In addition, leakage current and hot carrier effect can be effectively improved by forming lightly-doped-drain (LDD) regions having a same width or different widths.

Third Embodiment

In the following embodiment, the explanation for the elements having the same reference numbers recited in the above embodiments will be skipped.

FIGS. 13A–13D are schematic cross-sectional views of a thin film transistor showing the steps for fabricating a thin film transistor according to a third embodiment of the present invention.

Figure 13A:
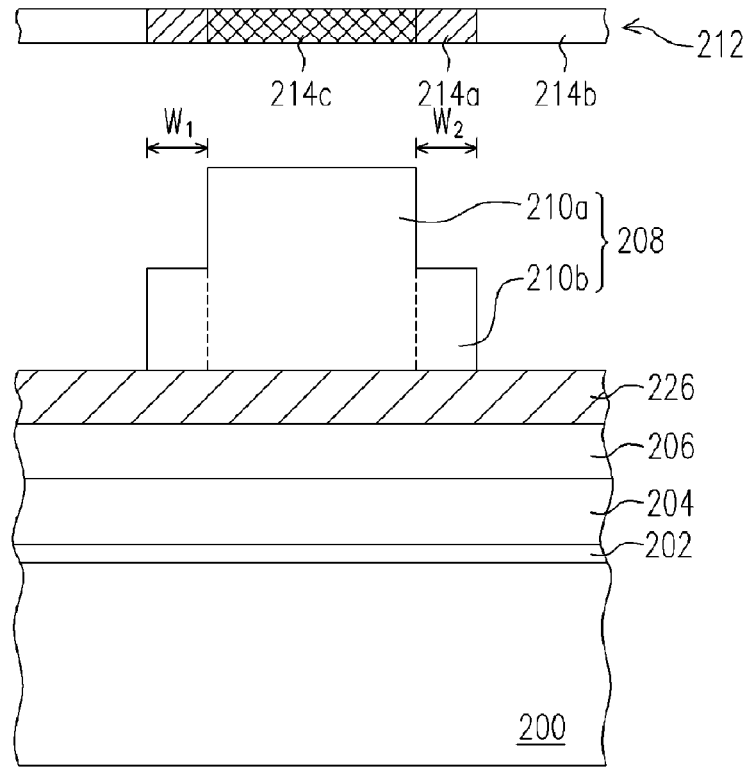
FIGS. 13A–13D are schematic cross-sectional views of a thin film transistor showing the steps for fabricating a thin film transistor according to a third embodiment of the present invention.
Figure 13B:
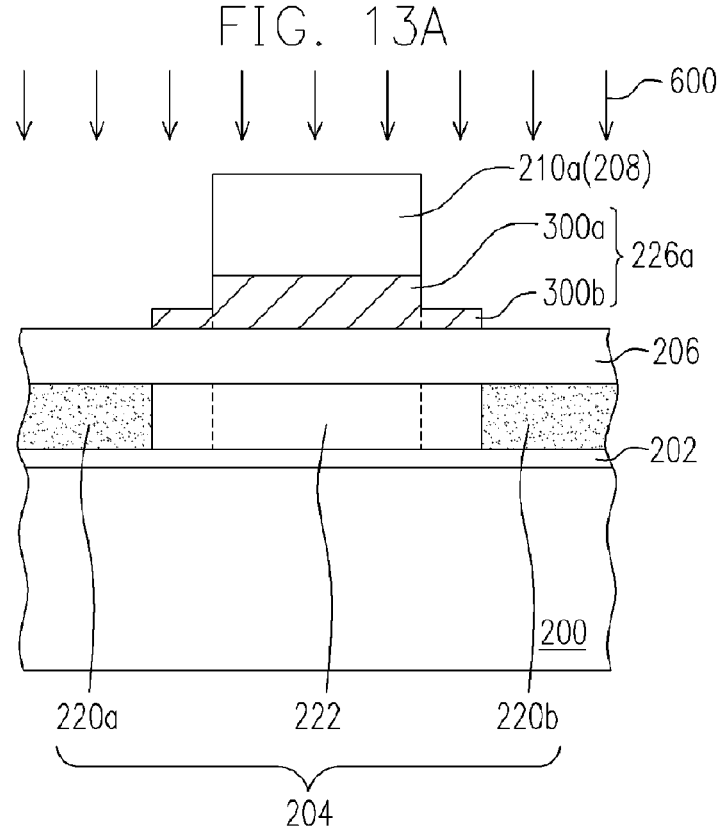
Figure 13C:
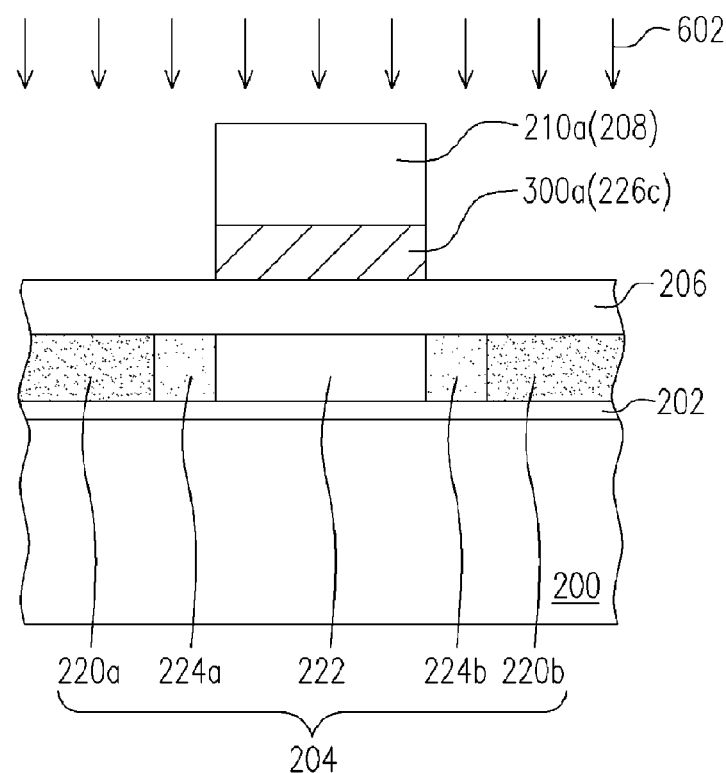

Referring to FIG. 13A, a polysilicon layer 204, a gate dielectric layer 206 and a gate layer 226 are sequentially formed over a substrate 200. Alternatively, a buffer layer 202 can be formed over the substrate 200 before forming the polysilicon layer 204.

A patterned photoresist mask 208 having a first portion 210a and a second portion 210b is formed over the gate layer 226. The second portion 210b is positioned at two sides of the first portion 210a and has a thickness smaller than that of the first portion 210a. The process of forming the patterned photoresist mask 208 over the gate layer 226 can be referred to the above discussion for the second embodiment, and the detailed explanation is omitted herein.

Referring to 13B, the gate layer 226a is patterned using an etching process with the patterned photoresist mask 208 acting as an etching mask. The patterned gate layer 226a has a fifth portion 300a and a sixth portion 300b, wherein the sixth portion 300b is positioned at two sides of the fifth portion 300a and has a thickness smaller than that of the fifth portion 300a. The process of forming the patterned gate layer 226a can be referred to the discussion of the above second embodiment, and the concerning explanation is omitted herein.

An ion implanting process for doping a source region 220a and a drain region 220b in the polysilicon layer 204 is performed with the patterned photoresist mask 208, the patterned gate layer 226a and the gate dielectric layer 206 acting as a doping mask.

In one embodiment, under the condition that n-type dopants 600 such as phosphorous atoms are doped with a dopant concentration ranging from $1*10^{14}$ to $1*10^{16}$ atoms per square centimeter for fabricating a n-type thin film transistor, the ion implanting process may provide a doping energy of 70 to 80 keV, for example.

Thereafter, the sixth portion 300b of the patterned gate layer 226a is removed using an etching process. Another ion implanting process for doping the source region 220a, the drain region 220b and lightly-doped-drain (LDD) regions 224a and 224b in the polysilicon layer 204 is performed with the remaining patterned photoresist mask 208 and the remaining patterned gate layer 226c acting as a doping mask. A channel region 222 is configured in the polysilicon layer 204 under the remaining patterned gate layer 226c, wherein the lightly-doped-drain (LDD) regions 224a and 224b are positioned between the channel region 222 and the source region 220a and between the channel region 222 and the drain region 220b.

In another embodiment, under the condition that n-type dopants 602 such as phosphorous atoms are doped with a dopant concentration ranging from $1*10^{13}$ to $1*10^{15}$ atoms per square centimeter for fabricating a n-type thin film transistor, the ion implanting process may provide a doping energy of 70 to 80 keV, for example.

Figure 13D:
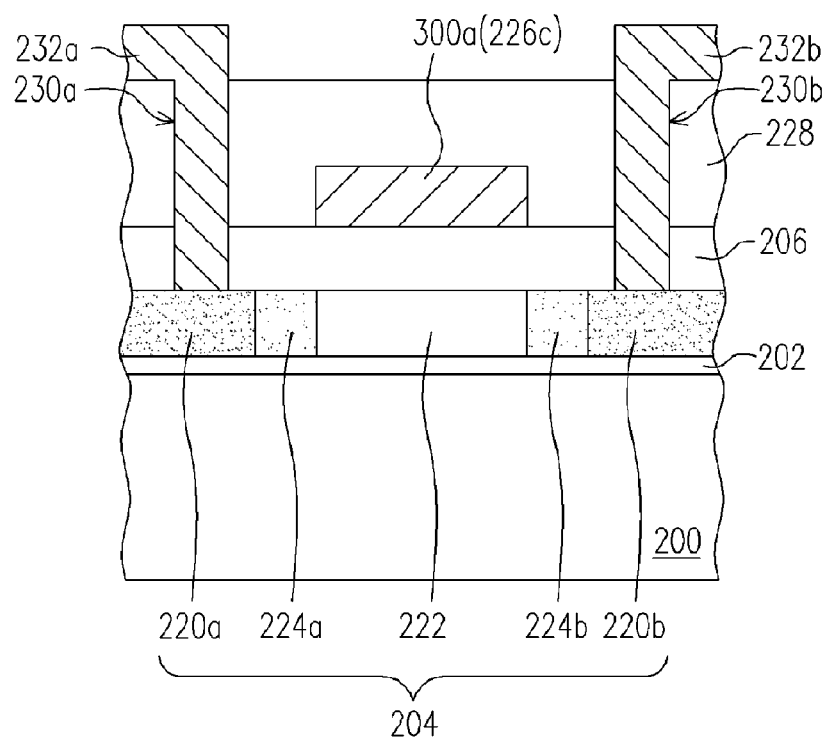

Thereafter, as shown in FIG. 13D, the patterned photoresist mask 208 is removed. In one embodiment, removing the patterned photoresist layer 208 is conducted after forming the patterned gate layer 226 and before performing ion implantation process 600. In another embodiment, after removing the patterned photoresist layer, a drain conductive layer and a source conductive layer are formed. The detail will be described in the following. After the patterned photoresist mask 208 is removed, a dielectric layer 228 is formed over the substrate 200 and covers the gate layer 226 and the patterned gate dielectric layer 206a. A source plug opening 230a and a drain plug opening 230b are formed passing through the dielectric layer 228 and the patterned gate dielectric layer 206a and exposing the source region 220a and the drain region 220b. Afterwards, a conductive layer including a source conductive layer 232a and a drain conductive layer 232b is formed over the dielectric layer 228 and in the source plug opening 230a and the drain plug opening 230b. The source conductive layer 232a is electrically connected to the source region 220a. The drain conductive layer 232b is electrically connected to the drain region 220b.

Figure 14A:
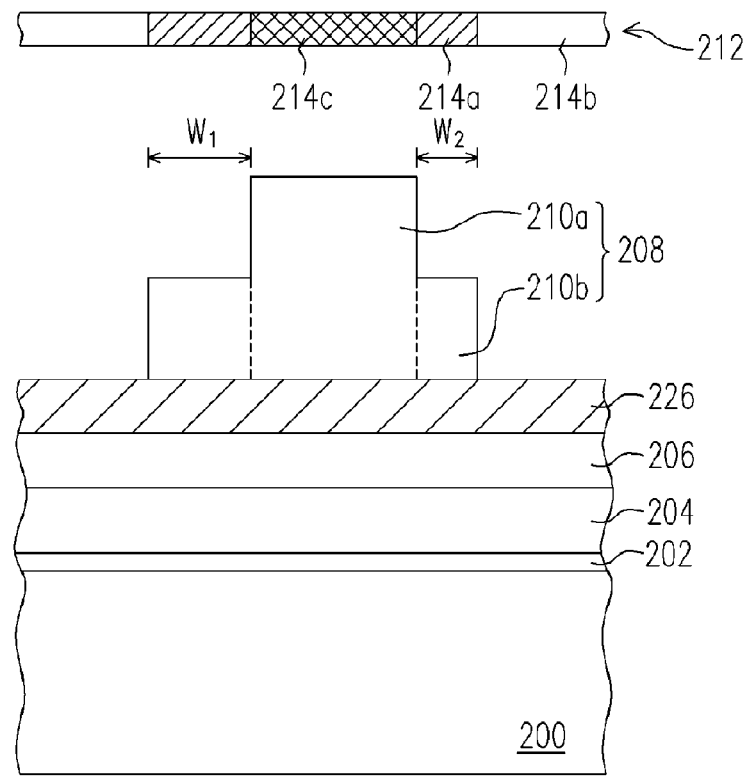
FIGS. 14A–14B are schematic cross-sectional views of a thin film transistor showing the steps for fabricating another thin film transistor according to the third embodiment of the present invention.
Figure 14B:
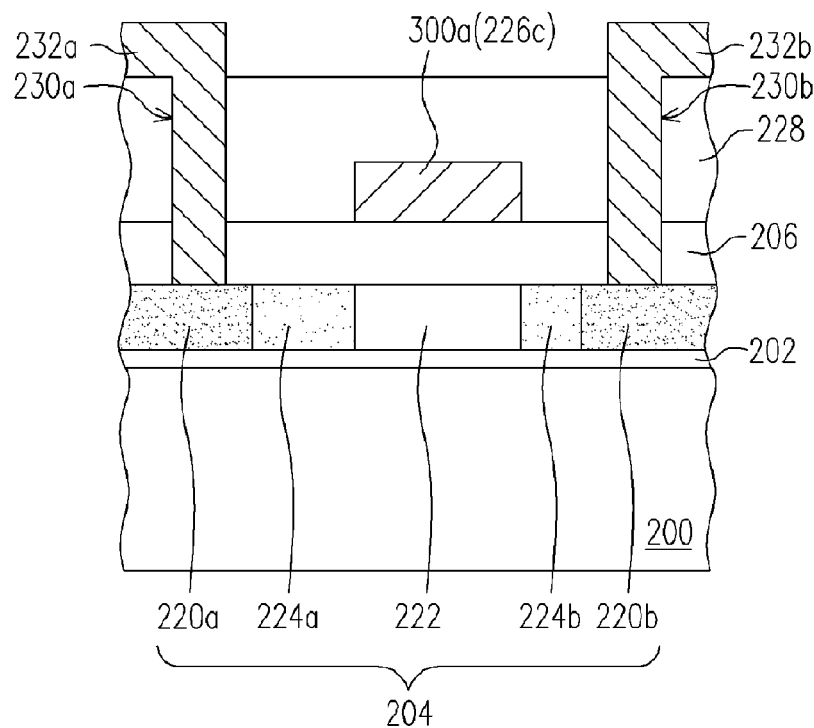
Figure 15A:
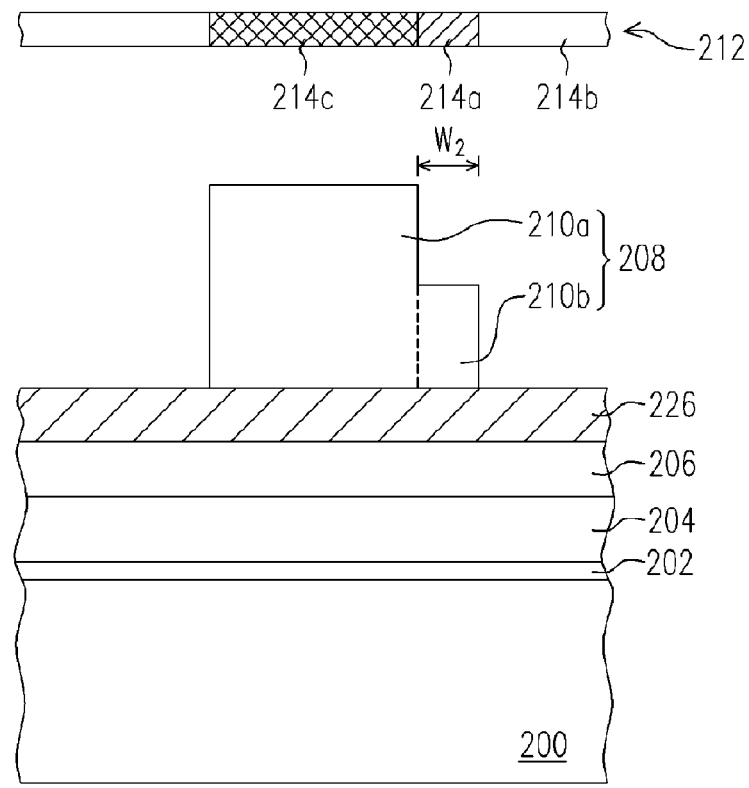
FIGS. 15A–15B are schematic cross-sectional views of a thin film transistor showing the steps for fabricating another thin film transistor according to the third embodiment of the present invention.
Figure 15B:
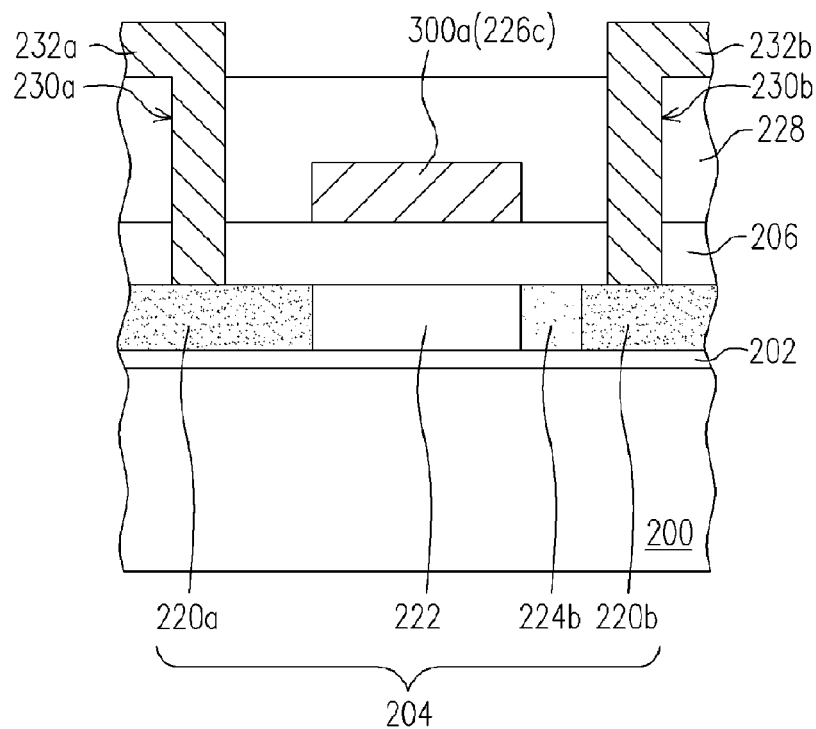

The widths w1 and w2 of the second portion 210b at two sides of the first portion 210a of the patterned photoresist mask 208 are equivalent as shown in FIG. 13A, but, alternatively, they can be different in practice. Referring to FIG. 14A, the widths w1 and w2 of the second portion 210b at two sides of the first portion 210a of the patterned photoresist mask 208 are different. Therefore, as shown in FIG. 14B, asymmetric lightly-doped-drain (LDD) regions 224a and 224b with different widths are formed after the steps of etching the gate dielectric layer 206 and implanting ions. Besides, referring to FIG. 15A, the second portion 210b is positioned at only one side of the first portion 210a of the patterned photoresist mask 208. Accordingly, as shown in FIG. 15B, only one lightly-doped-drain (LDD) region 224b can be formed after the steps of etching the gate dielectric layer 206 and implanting ions.

According to the above method of the present invention, the source region/drain region and the lightly-doped-drain (LDD) regions are formed by performing only one step of the photolithography process. Therefore, the above method is more efficient than the conventional method. In addition, leakage current and hot carrier effect can be effectively improved by forming lightly-doped-drain (LDD) regions having a same width or different widths.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method for fabricating a thin film transistor, comprising:
    forming a polysilicon layer over a substrate;
    forming a gate dielectric layer over said polysilicon layer;
    forming a patterned photoresist mask having a first portion and a second portion over said gate dielectric layer, wherein said second portion has a thickness smaller than that of said first portion;
    patterning said gate dielectric layer using an etching process with said patterned photoresist mask acting as an etching mask, said patterned gate dielectric layer having a third portion and a fourth portion, wherein said fourth portion is positioned at two sides of said third portion and has a thickness smaller than that of said third portion;
    performing an ion implanting process with said patterned photoresist mask and said patterned gate dielectric layer acting as a doping mask to form a source region and a drain region in said polysilicon layer under said fourth portion of said patterned gate dielectric layer and to form a lightly-doped-drain (LDD) region in said polysilicon layer under said third portion of said patterned gate dielectric layer, wherein a channel region is configured in said polysilicon layer under said first portion of said patterned photoresist mask, and said lightly-doped-drain (LDD) region is positioned between said channel region and said source region or between said channel region and said drain region;
    removing said patterned photoresist mask; and
    forming a gate layer over said gate dielectric layer and said channel region.

2. The method of claim 1, wherein the step of forming a patterned photoresist mask comprises:
    forming an original photoresist layer over said gate dielectric layer;
    exposing said original photoresist layer with a mask having a semi-transparent region, wherein said semi-transparent region of said mask is aligned with a lightly exposed portion of said original photoresist layer; and
    developing said original photoresist layer, wherein said lightly exposed portion of said original photoresist layer is partially removed to form said second portion.

3. The method of claim 1, wherein said lightly-doped-drain (LDD) region is formed between said channel region and said source region and between said channel region and said drain region when said second portion of said patterned photoresist mask is formed at two sides of said first portion.

4. The method of claim 3, wherein said lightly-doped-drain (LDD) region formed between said channel region and said source region has a same width as said lightly-doped-drain (LAD) region formed between said channel region and said drain region when said second portion of said patterned photoresist mask formed at two sides of said first portion has a same width.

5. The method of claim 3, wherein said lightly-doped-drain (LDD) region formed between said channel region and said source region has a width different from that of said lightly-doped-drain (LDD) region formed between said channel region and said drain region when said second portion formed at two sides of said first portion has different widths.

6. The method of claim 1, further comprising forming a buffer layer over said substrate before forming said polysilicon layer.

7. The method of claim 1, further comprising:
   forming a dielectric layer over said substrate, wherein said dielectric layer covers said gate layer and said patterned gate dielectric layer;
   forming a source plug opening and a drain plug opening passing through said dielectric layer and said patterned gate dielectric layer and exposing said source region and said drain region; and
   forming a source conductive layer and a drain conductive layer over said dielectric layer and in said source plug opening and said drain plug opening, wherein said source conductive layer is electrically connected to said source region and said drain conductive layer is electrically connected to said drain region.

8. A method for fabricating the thin film transistor, comprising:
   forming a polysilicon layer over a substrate;
   forming a gate dielectric layer over said polysilicon layer;
   forming a gate layer over said gate dielectric layer;
   forming a patterned photoresist mask having a first portion and a second portion over said gate layer, wherein said second portion has a thickness smaller than that of said first portion;
   patterning said gate layer and said gate dielectric layer using an etching process with said patterned photoresist mask acting as an etching mask, said patterned gate dielectric layer having a third portion and a fourth portion, wherein said fourth portion is positioned at two sides of said third portion and has a thickness smaller than that of said third portion; and
   performing an ion implanting process with said patterned photoresist mask and said patterned gate dielectric layer acting as a doping mask to form a source region and a drain region in said polysilicon layer under said fourth portion of said patterned gate dielectric layer and to form a lightly-doped-drain (LDD) region in said polysilicon layer under said third portion of said patterned gate dielectric layer, wherein a channel region is configured in said polysilicon layer under said third portion of said patterned gate layer, and said lightly-doped-drain (LDD) region is positioned between said channel region and said source region or between said channel region and said drain region.

9. The method of claim 8, wherein the step of forming a patterned photoresist mask comprises:
   forming an original photoresist layer over said gate layer;
   exposing said original photoresist layer with a mask having a semi-transparent region, wherein said semi-transparent region of said mask is aligned with a lightly exposed portion of said original photoresist layer; and
   developing said original photoresist layer, wherein said lightly exposed portion of said original photoresist layer is partially removed to form said second portion.

10. The method of claim 8, wherein said lightly-doped-drain (LDD) region is formed between said channel region and said source region and between said channel region and said drain region when said second portion of said patterned photoresist mask is formed at two sides of said first portion.

11. The method of claim 10, wherein said lightly-doped-drain (LDD) region formed between said channel region and said source region has a same width as said lightly-doped-drain (LDD) region formed between said channel region and said drain region when said second portion of said patterned photoresist mask formed at two sides of said first portion has a same width.

12. The method of claim 10, wherein said lightly-doped-drain (LDD) region formed between said channel region and said source region has a width different from that of said lightly-doped-drain (LDD) region formed between said channel region and said drain region when said second portion of said patterned photoresist mask formed at two sides of said first portion has different widths.

13. The method of claim 8, further comprising forming a buffer layer over said substrate before forming said polysilicon layer.

14. The method of claim 8 further comprising a step of removing the patterned photoresist layer, wherein the step of removing the patterned photoresist layer is conducted after forming the patterned gate layer and the patterned gate dielectric layer or performing the ion implantation process.

15. The method of claim 14, wherein after performing the ion implantation process and removing the patterned photoresist layer thereafter, the method further comprising:
   forming a dielectric layer over said substrate, wherein said dielectric layer covers said gate layer and said patterned gate dielectric layer;
   forming a source plug opening and a drain plug opening passing through said dielectric layer and said patterned gate dielectric layer and exposing said source region and said drain region; and
   forming a source conductive layer and a drain conductive layer over said dielectric layer and in said source plug opening and said drain plug opening, wherein said source conductive layer is electrically connected to said source region and said drain conductive layer is electrically connected to said drain region.

16. A method for fabricating the thin film transistor, comprising:
   forming a polysilicon layer over a substrate;
   forming a gate dielectric layer over said polysilicon layer;
   forming a gate layer over said gate dielectric layer;
   forming a patterned photoresist mask having a first portion and a second portion over said gate layer, wherein said second portion has a thickness smaller than that of said first portion;
   patterning said gate layer using an etching process with said patterned photoresist mask acting as an etching mask, said patterned gate layer having a fifth portion and a sixth portion, wherein said sixth portion has a thickness smaller than that of said fifth portion;
   performing a first ion implanting process for doping a source region and a drain region in said polysilicon layer with said patterned photoresist mask and said patterned gate layer acting as a doping mask;
   removing said sixth portion of said patterned gate layer; and
   performing a second ion implanting process for doping said source region, said drain region and a lightly-doped-drain (LDD) region in said polysilicon layer with said remaining patterned photoresist mask and said remaining patterned gate layer acting as a doping mask, wherein a a channel region is configured in said polysilicon layer under said remaining patterned gate layer, said lightly-doped-drain (LDD) region is positioned between said channel region and said source region or between said channel region and said drain region.

17. The method of claim 16, wherein the step of forming a patterned photoresist mask comprises:
   forming an original photoresist layer over said gate layer;
   exposing said original photoresist layer with a mask having a semi-transparent region, wherein said semi-transparent region of said mask is aligned with a lightly exposed portion of said original photoresist layer; and developing said original photoresist layer, wherein said lightly exposed portion of said original photoresist layer is partially removed to form said second portion.

18. The method of claim 16, wherein said lightly-doped-drain (LDD) region is formed between said channel region and said source region and between said channel region and said drain region when said second portion of said patterned photoresist mask is formed at two sides of said first portion.

19. The method of claim 18, wherein said lightly-doped-drain (LDD) region formed between said channel region and said source region has a same width as said lightly-doped-drain (LDD) region formed between said channel region and said drain region when said second portion of said patterned photoresist mask formed at two sides of said first portion has a same width.

20. The method of claim 18, wherein said lightly-doped-drain (LDD) region formed between said channel region and said source region has a width different from that of said lightly-doped-drain (LDD) region formed between said channel region and said drain region when said second portion of said patterned photoresist mask formed at two sides of said first portion has different widths.

21. The method of claim 16, further comprising forming a buffer layer over said substrate before forming said polysilicon layer.

22. The method of claim 16 further comprising removing the patterned photoresist layer, wherein the step of removing the patterned photoresist laeyr is conducted after forming the patterned gate layer and before performing the first ion implantation process or after performing the second ion implantation process.

23. The method of claim 22, wherein after performing the second ion implantation process and removing the patterned photoresist layer thereafter, the method further comprising:

forming a dielectric layer over said substrate, wherein said dielectric layer covers said gate layer and said patterned gate dielectric layer;

forming a source plug opening and a drain plug opening passing through said dielectric layer and said patterned gate dielectric layer and exposing said source region and said drain region; and forming a source conductive layer and a drain conductive layer over said dielectric layer and in said source plug opening and said drain plug opening, wherein said source conductive layer is electrically connected to said source region and said drain conductive layer is electrically connected to said drain region.

* * * * *